United States Patent [19]

Shannon

[11] Patent Number: 4,750,023
[45] Date of Patent: Jun. 7, 1988

[54] SEMICONDUCTOR DEVICES HAVING GATE-CONTROLLED UNIPOLAR HOT-CARRIER TRANSISTORS AND THEIR MANUFACTURE

[75] Inventor: John M. Shannon, Whyteleafe, England

[73] Assignee: U.S. Philips Corporation, New York, N.Y.

[21] Appl. No.: 59,146

[22] Filed: Jun. 5, 1987

Related U.S. Application Data

[63] Continuation of Ser. No. 786,151, Oct. 8, 1985, abandoned, which is a continuation of Ser. No. 489,285, Apr. 28, 1983, abandoned.

[30] Foreign Application Priority Data

May 10, 1982 [GB] United Kingdom ............... 8213502

[51] Int. Cl.[4] ............................................. H01L 29/78
[52] U.S. Cl. ....................................... 357/23.3; 357/13; 357/22; 357/23.4; 357/23.12
[58] Field of Search ................. 357/16, 22, 23.3, 23.4, 357/23.12, 13, 90

[56] References Cited

U.S. PATENT DOCUMENTS

| | | | |
|---|---|---|---|
| 3,761,785 | 9/1973 | Pruniaux | 357/23.4 |
| 3,846,822 | 11/1974 | Riley et al. | 357/23.4 |
| 3,940,783 | 2/1976 | Polata | 357/13 |
| 4,081,817 | 3/1978 | Hara | 357/23.3 |
| 4,149,174 | 4/1979 | Shannon | 357/90 |
| 4,194,214 | 3/1980 | Awane et al. | 357/23.4 |
| 4,229,756 | 10/1980 | Sato et al. | 357/23.4 |
| 4,263,057 | 4/1981 | Ipri | 357/23.3 |
| 4,278,986 | 7/1981 | Mader | 357/13 |
| 4,353,081 | 10/1982 | Allyn et al. | 357/16 |
| 4,410,902 | 10/1983 | Malik | 357/13 |
| 4,455,565 | 6/1984 | Goodman et al. | 357/23.4 |

OTHER PUBLICATIONS

P. Richman, "MOS FETs and ICs," 1973, John Wiley & Sons, TK 7871.85.R466, pp. 115-119.
C. Buzler et al., "Fab. & Num. Sim. of Perm. Base Trans.," IEEE Trans. on Elec. Dev., vol. 27, #6, Jun. 1980, pp. 1128-1140.

Primary Examiner—Joseph E. Clawson Jr.
Attorney, Agent, or Firm—Jack Oisher; Steven R. Biren

[57] ABSTRACT

Semiconductor devices including one or more gate-controlled unipolar hot-carrier transistors have a semiconductor barrier region located between laterally-separated first and second region portions of one conductivity type. The barrier region has a net doping concentration of the opposite conductivity type and is sufficiently thin such that the depletion layers formed at zero bias with both the first and second regions substantially merge together to deplete the barrier region of mobile charge carriers. Current flow between the first and second region is at least partially by thermionic emission of charge carriers of the one conductivity type across the barrier region at a major surface of the body. The transistor has a gate in the vicinity of the barrier region and capacitively coupled thereto (for example via a dielectric layer) so as to permit the thermionic emission current to be controlled by applying a voltage to the gate to adjust the effective barrier height of the barrier region. Such transistors can be very compact and can have a fast response time with strong gate control. The gate may be located on either side of the barrier region, and junction-gates as well as insulated-gates may be used.

20 Claims, 3 Drawing Sheets

SEMICONDUCTOR DEVICES HAVING GATE-CONTROLLED UNIPOLAR HOT-CARRIER TRANSISTORS AND THEIR MANUFACTURE

This is a continuation of application Ser. No. 786,151, filed Oct. 8, 1985, which was a continuation of application Ser. No. 489,285, filed Apr. 28, 1983, both now abandoned.

BACKGROUND OF THE INVENTION

This invention relates to semiconductor devices comprising one or more gate-controlled unipolar hot-carrier transistors, particularly but not exclusively for fast logic, fast switching or very high frequency amplification applications, which transistors can have a fast response time with strong control by a small gate signal. The invention further relates to methods of manufacturing such semiconductor devices.

The paper entitled "A New Majority-Carrier Diode—The Camel Diode" by Dr. J. M. Shannon, published in the Japanese Journal of Applied Physics, Vol. 19, Supplement No. 1 (1980), pages 301 to 304, discloses a semiconductor device comprising a semiconductor body including first and second semiconductor regions of one conductivity type, and a semiconductor barrier region located between the first and second regions, said barrier region having a net doping concentration of the opposite conductivity type and being sufficiently thin such that the depletion layers formed at zero bias with both the first and second regions merge together substantially to deplete said barrier region of mobile charge carriers. Current flow between the first and second regions during operation of the device is at least partially by thermionic emission of charge carriers of said one conductivity type across said barrier region.

The paper describes good quality bulk unipolar diodes having a very thin highly-doped p-type barrier region which forms a potential hump in the bulk of the semiconductor body, between an overlying highly-doped n-type first region and a low-doped n-type substrate which forms the second region. The current flow through the diode occurs between the vertically-separated first and second regions and so is substantially perpendicular to the major surface of the body. The effect of the doping concentrations on the barrier height is described in said paper, and an approximate theoretical relationship is also given.

Compared with a metal-semiconductor Schottky diode, such a camel diode has an advantage in that the diode barrier is formed in the semiconductor bulk, and hence away from the semiconductor body surface. The doping level in the barrier region is sufficiently high such that the energy-band bending around the potential maximum is about or greater than k.T (where k is Boltzmann's constant and T is the absolute temperature) over a distance comparable with the charge-carrier mean-free path. Under these circumstances the current flow appears to be dominated by thermionic emission of majority carriers (i.e. charge carriers of said one conductivity type) over the potential barrier, and the current-voltage relationship is similar to that for a Schottky barrier having the same effective barrier height $\phi$. Thus the current flow over the barrier varies exponentially with the barrier height, the exponent depending on the quality of the diode.

Several different camel diode structures are described in U.S. Pat. No. 4,149,174, and the use of such depleted barrier regions for the base-collector barriers of hot-carrier transistors is also described. The present invention provides a quite different hot-carrier transistor structure in which the barrier height of the barrier region is controlled to provide transistor characteristics.

SUMMARY OF THE INVENTION

According to a first aspect of the present invention there is provided a semiconductor device comprising a semiconductor body including first and second semiconductor regions of one conductivity type, and a semiconductor barrier region located between the first and second regions. The barrier region has a net doping concentration of the opposite conductivity type and is sufficiently thin such that the depletion layers formed at zero bias with both the first and second regions merge together substantially to deplete said barrier region of mobile charge carriers, current flow between the first and second regions during operation of the device being at least partially by thermionic emission of charge carriers of said one conductivity type across said barrier region. The barrier region across which thermionic emission occurs is located between laterally-separated portions of the first and second regions and extends to a major surface of the body so that the current flow across the barrier region is adjacent to said major surface, and said barrier region forms part of a gate-controlled unipolar hot-carrier transistor having a gate in the vicinity of the barrier region at said major surface. The gate is capacitively coupled to said barrier region so as to permit the current flow by thermionic emission of the charge carriers between the laterally-separated portions of the first and second regions to be controlled by applying a voltage to the gate to adjust the effective barrier height of the barrier region.

Such a gate-controlled unipolar hot-carrier transistor in accordance with the present invention has a comparatively simple, compact structure in which the current flow through the transistor is controlled by adjusting the barrier height of the barrier region by means of the voltage applied to the gate. Since with thermionic emission the current flow varies exponentially with the barrier height a strong variation of current flow with gate voltage can be obtained with a transistor in accordance with the invention. The barrier region, at least where it extends to the major surface, may be very thin, for example a thickness of approximately 20 nm (nanometers) or less, so that the transistor can be extremely small and very fast. Such a transistor can also be readily integrated in a monolithic transistor circuit.

As will be described hereinafter, the gate may be capacitively coupled to the barrier region in different ways. Thus, the capacitive coupling may be through a reverse-biased rectifying junction between the gate and one of the laterally-separated portions of the first and second regions. Such a junction-gate structure can be used to turn off a transistor which is in the conducting state with zero voltage applied to the gate. However it is less easy to use such a junction-gate to turn on transistors, since in this case forward-biasing of the junction is required so that only very small gate voltages (e.g. less than 0.25 V) can be used. A more versatile transistor structure is obtained when the gate is a conductive layer which is present on and capacitively coupled through an insulating dielectric layer on said major surface. In this case the barrier region at said major surface can be provided very close to or even substantially aligned with an edge of said conductive layer of the gate, thereby providing very good capacitive coupling. Furthermore a transistor with such an insulated-gate structure may readily be designed for use with either a forwrd or reverse gate bias voltage or even with both, so that a wide range of control is possible (for example over a gate voltage range of 10 V) and the effective barrier height of the barrier region can be decreased or increased depending on the polarity of the gate voltage.

Thus, a device in accordance with the invention may be such that the barrier height of the barrier region at zero bias is sufficiently high that said transistor is non-conducting until the barrier height is reduced by applying a voltage to the gate; such a transistor may be designated as being of the "normally-off" type. Alternatively the barrier height at zero bias may be sufficiently low to render said transistor conducting by applying a bias voltage between the first and second regions even with zero voltage applied to the gate; such a transistor may be designated as being of the "normally-on" type. In this latter case the gate voltage may be used to turn off the transistor, or the transistor may be such that it can be turned off by a gate voltage of one polarity and rendered more strongly conductive by a gate voltage of the opposite polarity. In order to precisely control the barrier height of the barrier region at zero bias there is preferably provided adjacent the major surface (for example by dopant ion implantation) an additional doping concentration at least in one of the laterally-separated portions of the first and second regions adjacent the barrier region.

In order to improve the capacitive coupling of the barrier region where the gate extends over a part of one of the laterally-separated portions, it is advantageous for this part to be depleted over the area below the gate by a depletion layer which is formed with the barrier region at zero bias or which (in the case of a rectifying-junction gate) is formed by the junction of the gate.

The barrier region may extend across the thickness of an isolated semicondctor layer to separate entirely first and second regions of the layer on a substrate. However, it is generally convenient for manufacturing purposes and sometimes necessary for desired device characteristics for one of the first and second regions to extend below the other, as well as being laterally separated therefrom. In this case, a semiconductor barrier region having a net doping concentration of said opposite conductivity type may extend between vertically-separated portions of the first and second regions. Since the gate adjusts the barrier height of the barrier region extending to the major surface between the laterally-separated portions of the first and second regions, it is generally desirable for optimum gate control purposes for the barrier height of the barrier region extending to the major surface between said laterally-separated portions to be no higher (and preferably even lower) than that between said vertically-separated portions. It is generally convenient to fabricate such a barrier region between the vertically-separated portions as a single semiconductor region with the barrier region between the laterally-separated portions. In this case, a higher barrier height between said vertically-separated portions can still be readily obtained when the barrier region at that area is undepleted over part of its thickness at zero bias or has a larger thickness or doping concentration (even though fully depleted).

In order to reliably determine the barrier height and quality of the barrier between the laterally-separated portions of the first and second regions, it is important to control the thickness and doping concentration of the barrier region in this area. For this purpose there is provided in accordance with a second aspect of the present invention a method of manufacturing a semiconductor device in accordance with the first aspect, and comprising the steps of:

(a) forming at said surface of the body an implantation masking layer having an implantation window, (b) implanting dopant ions of said one conductivity type in the body at said implantation window to provide the conductivity-type determining doping concentration of the one conductivity type for said first region, (c) implanting dopant ions of said opposite conductivity type in the body at the implantation window to provide the doping concentration of the opposite conductivity for the barrier region at said one area where it extends to said major surface, and (d) providing the gate in the vicinity of said barrier region where it extends to said major surface.

As will be described in detail hereinafter, an edge of the gate and the barrier region can be substantially aligned in a reliable manner when, for the implantation steps (b) and (c), the implantation masking layer comprises a conductive layer which provides the gate.

BRIEF DESCRIPTION OF THE DRAWING

Embodiments of the present invention will now be described, by way of example, with reference to the accompanying drawing, in which.

Figure 1:
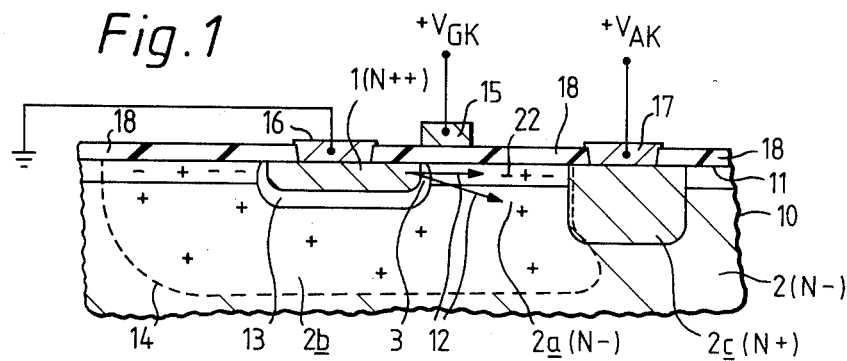
FIG. 1 is a cross-sectional view of a "normally-off" gate-controlled unipolar hot-electron transistor in accordance with a first aspect of the invention.

It should be noted that all of the Figures are diagrammatic and not drawn to scale. The relative dimensions and proportions of some parts of these Figures (particularly the thickness of these parts) have been shown exaggerated or reduced for the sake of clarity and convenience in the drawing. The same reference numerals as used in one embodiment are generally used to refer to corresponding or similar parts in the other embodiments. Furthermore it should be noted that for clarity in the drawing the semiconductor body portions depleted by the depletion layers in the device are not hatched in the cross-sectional views of FIGS. 1, 3, 4, 5 and 7.

DESCRIPTION OF THE PREFERRED EMBODIMENTS

Figure 2:
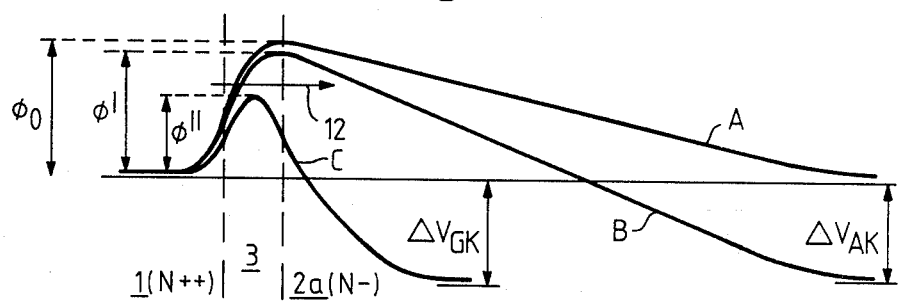
FIG. 2 is an energy diagram laterally through the barrier region of the transistor of FIG. 1, both under bias and zero bias conditions.

The transistor illustrated in FIGS. 1 and 2 is a unipolar hot-electron device comprising a monocrystalline silicon semiconductor body 10 including first and second n-type semiconductor regions 1 and 2 separated by a semiconductor barrier region 3 which has a net doping concentration of the opposite conductivity type. The barrier region 3 is of the so-called "camel" type disclosed in the previously-mentioned published paper by Dr. J. M. Shannon and in U.S. Pat. No. 4149174. However, whereas in these previous publications the active barrier region is between vertically-separated portions of first and second n-type regions, the important active barrier region in this device in accordance with the present invention extends to the upper major surface 11 of the body 10 and is located between the first region 1 and a portion 2a of the second region 2 which this barrier region 3 laterally separates from the first region 1. The energy diagram of FIG. 2 is taken through this barrier region 3 between the laterally-separated portions 1 and 2a. There is also present between the regions 1 and 2 in the FIG. 1 device a barrier region 13 which extends substantially parallel to the major surface 11. Although forming a single semiconductor region with the barrier region 3, this barrier region 13 has a higher barrier height, as will be described hereinafter, and so the barrier region 13 does not usually have any significant effect on the device characteristics.

The p-type doping concentration and thickness of the barrier region 3 between the laterally-separated portions 1 and 2a are chosen such that, in thermal equilibrium, the barrier region 3 is fully depleted of holes by the natural energy-band bending in the semiconductor structure. Thus, the depletion layers which the region 3 forms at zero bias with both the laterally-separated portions 1 and 2a merge together in the region 3 at zero bias to form a negative space-charge region with a potential peak forming the barrier of height $\phi_o$ (at zero bias) between the portions 1 and 2a as illustrated by curve A in FIG. 2. In the device structure of FIG. 1 the first region 1 is a highly-doped single region (N++) whereas most of the second region is only lightly-doped (N−). In these circumstances the potential maximum in the barrier region 3 lies close to the interface of the region 3 with the low-doped region portion 2a. The extent of the depletion layer in the low-doped region 2 is indicated in FIG. 1 by the broken line 14 with plus signs to indicate its positive space charge. Because of lack of room in the drawing, the very small extent of the depletion layer in the highly-doped region 1 is not indicated in FIG. 1, and for the same reason plus and negative signs are not included to indicate the positive and negative space charge in the depletion layers in regions 1 and 3 respectively.

When the barrier region 3 is reverse-biased by biasing the second region 2 positively with respect to the first region 1 by a voltage $V_{AK}$, the extra space charge in the depletion layer in the second region 2 is balanced by movement of the potential maximum in the region 3 towards the interface with the highly-doped first region 1. This situation is illustrated by curve B in FIG. 2. The fully-depleted p-type doping concentration in the barrier region 3 is sufficiently high that this movement of the potential maximum is small and the barrier height $\phi$ relative to the highly-doped n-type region 1 is only slightly sensitive to the magnitude of the reverse-bias voltage $V_{AK}$.

An approximate value for the barrier height $\phi$ can be derived using Poisson's equation with a simplification of the situation by assuming a uniformly-doped barrier region 3, a degenerately-doped first region 1, and neglecting band bending in the low-doped second region 2. In these circumstances the barrier height $\phi$ is given by:

$$\phi = q.t^2.N_A.(2\epsilon.\epsilon_o)^{-1} - V.(N_D/N_A) - t.(\epsilon.\epsilon_o)^{-1}.X^{\frac{1}{2}} \quad (1)$$

where $$X = t^2.q^2.N_D.(N_D + N_A) - 2\epsilon.\epsilon_o.q.N_D.V$$

t is the thickness of the barrier region 3,
$N_A$ is the p-type doping concentration of the barrier region 3,
$\epsilon_o$ is the permittivity of free space,
$\epsilon$ is the relative permittivity of the semiconductor material,
$N_D$ is the n-type doping concentration of the low-doped region 2,
q is the charge on an electron, and
V is the applied voltage across the barrier.
$\phi = \phi_o$ with zero bias (i.e. V=O). $\phi = \phi'$ when the voltge (V) applied across the barrier is the reverse-bias voltage $V_{AK}$.

The p-type doping concentration in the barrier region 3 is chosen to be sufficiently high that the energy-band bending around the potential maximum is about or greater than k.T over a distance comparable with the charge-carrier mean-free path. Under these circumstances the electron current flow from the first region 1 to the laterally-separated portion 2a of the second region 2 appears to be dominated by thermionic emission of electrons over the potential barrier $\phi$ and varies exponentially with the barrier height $\phi$ approximately in accordance with the following relationship:

$$J = S \cdot A \cdot T^2 \cdot e^{-\frac{q \cdot \phi}{k \cdot T}} \cdot e^{\frac{q \cdot V}{n \cdot k \cdot T}} \cdot \left(1 - e^{-\frac{q \cdot V}{k \cdot T}}\right) \quad (2)$$

where
J is the current density over the barrier,
S is the area of the barrier,
A is Richardson's constant,
T is the absolute temperature,
$\phi$ is the barrier height,
q is the charge on an electron,
k is Boltzmann's constant,
V is the applied voltage across the barrier, and
n is an ideality factor which is a function of the doping concentration in the low-doped region 2.

In the device of FIG. 1 in accordance with the present invention this thermionic emission occurs at the area between the laterally-separated portions 1 and 2a so that the electron current flow between the regions 1 and 2 occurs across the region 3 adjacent to the major surface 11 as indicated by arrows 12 in FIG. 1.

Furthermore, in accordance with the present invention the device of FIG. 1 is a gate-controlled unipolar transistor having a simple and compact structure formed by adding a gate 15 in the vicinity of the barrier region 3 at the major surface 11. The gate 15 is capacitively coupled to the barrier region 3 to adjust its effective barrier height.

A metal layer electrode 16 forms an electrical connection to the n-type first region 1 which constitutes a cathode of the transistor. Via a highly-doped n-type contact zone 2c, a metal layer electrode 17 forms an electrical connection to the low-doped n-type second region 2 which constitutes an anode of the transistor. If so desired the designations "emitter and collector" or "source and drain" may be used instead of the designation "cathode and anode". The reverse-bias voltage $V_{AK}$ is applied between these main-current carrying connections 16 and 17 of the device. In the lateral form illustrated in FIG. 1. the anode contact zone 2c and connection 17 are also present at the same major surface 11 as the cathode connection 16 and gate 15. In the transistor of FIGS. 1 and 2, the height $\phi_o$ of the barrier region 3 at zero bias is sufficiently high that the transistor with bias voltage $V_{AK}$ is non-conducting until a suitable voltage is applied to the gate 15. Such a transistor is of the "normally-off" type.

In the embodiment of FIG. 1, the gate 15 is formed by a conductive layer (of for example highly-doped polycrystalline silicon) which is present on a dielectric layer 18 (of for example silicon dioxide) on the surface 11 and which also provides a conductive track extending away from this area as an electrical connection to the gate 15. By applying a voltage $V_{GK}$ to the gate 15 via this gate connection the effective barrier height $\phi$ of the barrier region 3 at this area can be adjusted and the thermionic emission of the electrons between the first and second regions 1 and 2 can be controlled in accordance with the present invention.

Thus, the gate 15 is capacitively coupled to the barrier region 3 through the dielectric layer 18. In the particular form illustrated in FIG. 1 the barrier region 3 is substantially aligned with an edge of the gate 15 which extends over part of the second region portion 2a where it is coupled to the barrier region 3 via the depletion layer and associated positive space charge in this part of portion 2a. As indicated by the broken line 14 and associated plus signs in FIG. 1, this depletion layer and associated positive space charge extends across the whole of the portion 2a adjacent the surface 11, from the barrier region 3 to the contact zone 2c. As indicated by the band bending in FIG. 2, a depletion layer and associated positive space charge also extends a short distance into the highly-doped cathode region 1. With zero gate voltage most of the negative space-charge in the barrier region 3 is balanced by the positive space-charge in the slightly-depleted cathode region 1. Compared with the width of the depletion layer 14 across the region portion 2a, the gate 15 is very much closer to the barrier region 1, and so the capacitance coupling of the gate 15 to the barrier region 3 is very much larger than that between the barrier region 3 and the edge of the anode depletion region. As a result of this larger coupling, an incremental change $\Delta V_{GK}$ in the gate voltage will have a stronger affect on the barrier height $\phi$ of the barrier region 3 than will an equal increment $\Delta V_{AK}$ applied to the anode connection 17. In this manner transistor characteristics are obtained in which the current flowing between the cathode and anode regions 1 and 2 is strongly controlled by the gate-voltage $V_{GK}$ and only slightly sensitive to the anode voltage $V_{AK}$.

In FIGS. 1 and 2 this control is achieved with a positive voltage ($+V_{GK}$) applied to the gate 15. The associated positive charge on the gate 15 reduces the barrier height $\phi$ by compensating part of the negative space-charge in the barrier region 3 thereby reducing the magnitude of the positive space-charge of the slightly-depleted cathode region 1 which is required to balance the remainder of the negative charge. This reduces the band-bending in the cathode region 1 which determines the effective barrier height $\phi$. A reduced barrier height $\phi''$ results as illustrated by curve C in FIG. 2, thereby increasing the thermionic emission current 12 across the barrier region 3 between the cathode and anode regions 1 and 2 so that the "normally-off" transistor of FIGS. 1 and 2 can be turned on in this manner. The change in effective barrier height $\phi$ can be approximately proportional to the gate voltage $V_{GK}$ so that (as indicated by equation (2) above) the current 12 will increase approximately exponentially with gate voltage $V_{GK}$ to a high value limited by negative space-charge resulting from a high electron current in the region 2.

Since the insulating dielectric layer 18 may contain fixed positive charge it is advantageous to compensate this charge at least partially so as to minimize the sensitivity of the barrier height $\phi$ to $V_{AK}$. This can be effected in a reliably reproduceable manner using a shallow acceptor ion implant adjacent the surface 11 at least in the region portion 2a to introduce a negative space-charge (indicated by minus signs 22 in FIG. 1) in the region portion 2a under the insulating dielectric layer 18.

In the device structure of FIG. 1, the very thin barrier region 3 is substantially aligned with an edge of the gate 15. This gate 15 may overlap the very thin barrier region 3 and may even extend slightly over part of the cathode region 1 if so desired. However, the gate 15 may be spaced slightly from the barrier region 3; in this case the barrier region 3 may be influenced to a greater depth by the gate 15, although the degree of gate control reduces with increased spacing so that a large spacing is not desirable.

A barrier region 13 having a net doping concentration of the opposite (p-type) conductivity type forms a vertical separation between the cathode region 1 and the underlying portion 2b of the anode region 2. As mentioned before this region 13 has a higher barrier height than the region 3, and this ensures that the current flow between the cathode and anode regions 1 and 2 is controlled by the barrier height of the barrier region 3 (under the control of the gate 15) instead of by the barrier region 13. For this purpose at least the thickness of the barrier region 13 is larger than that of the barrier region 3. The barrier region 13 may be fully depleted or it may have over part of its thickness a p-type portion which is undepleted of free charge carriers by the depletion layers which the region 13 forms at zero bias with the region 1 and region portion 2b. The region 13 can be formed integrally and simultaneously with the barrier region 3 using implantation processes as will be described later.

Figure 3:
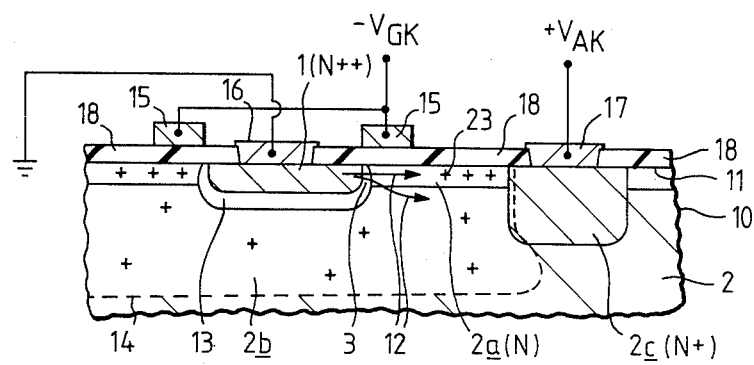
FIG. 3 is a cross-sectional view of a "normally-on" gate-controlled unipolar hot-electron transistor in accordance with the first aspect of the invention.

FIG. 3 illustrates a "normally-on" transistor as a modification of the FIG. 1 structure, in which at least the lateral portion 2a of the anode region 2 has a higher n-type doping concentration 23 than in FIG. 1. This higher-doping concentration 23 may be effected by a precise donor ion implantation adjacent the barrier region 3 and adjacent the major surface 11. In this case, the barrier height $\phi_o$ of the barrier region 3 at zero bias is significantly lower than for the FIG. 1 structure, and a significant current flow of hot electrons can occur by thermionic emission across the barrier $\phi'$ of the reverse-biased barrier region 3 with zero gate voltage. However the current flow can be decreased by applying a negative gate voltage ($-V_{GK}$ in FIG. 3) which compensates part of the positive space-charge in the depleted anode region portion 2a and the slightly-depleted cathode region 1 thereby increasing the barrier height to above $\phi'$. The current flow 12 across the barrier region 3 decreases approximately exponentially with increasing (negative) gate voltage, and the transistor can be switched off in this manner. It is also possible for the region portion 2a to have a moderate doping concentration (i.e. not too high and not too low) so that the transistor current may be increased or decreased, depending on whether the applied gate voltage is positive or negative. In the device structure of FIG. 3, the gate 15 is of annular configuration and extends around the cathode region 1 to control the thermionic emission around the whole of the barrier region 3 adjacent the surface 11.

Figure 4:
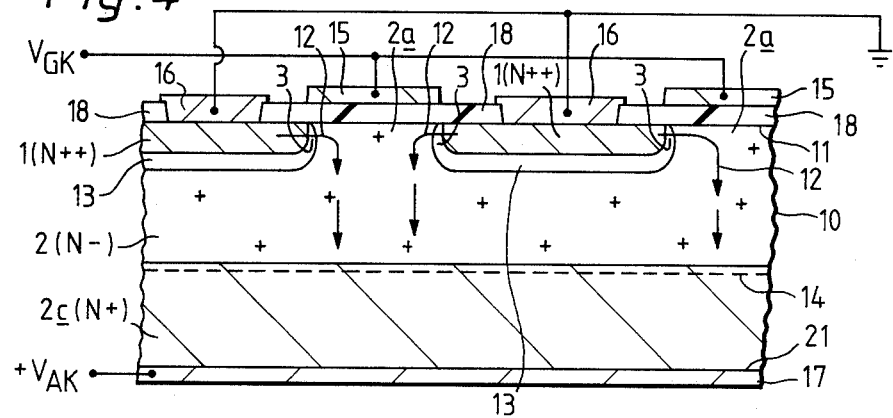
FIG. 4 is a cross-sectional view of a gate-controlled unipolar hot-electron transistor in accordance with the first aspect of the invention, and having a vertical electrode configuration.

In thd device structures of FIGS. 1 and 3 the whole current path from the cathode region 1 to the anode electrode 2c, 17 is substantially parallel to the major surface 11 of the body 10, as indicated by arrows 12. Such transistors may be designated as being of the "lateral" type, and are well suited for low power, fast logic circuit applications. FIG. 4 illustrates a further modification which is also in accordance with the invention, in which although the current flow from the cathode region 1 to the anode region 2 is across the barrier region 3 adjacent and substantially parallel to the upper major surface 11, the continuation of that current path to the anode electrode 2c, 17 is substantially perpendicular to the surface 11. Such a transistor may be designated as being of the "vertical" type. In the specific form illustrated in FIG. 4, the anode contact zone is a highly-doped n-type substrate 2c on which the lower-doped portion of the region 2 is formed as an epitaxial layer, and the metal layer electrode 17 is a metallization present over the whole bottom major surface 21 of the body 10. Such a vertical structure is particularly useful for a high current, power transistor in accordance with the invention, in which case an alternating pattern of n-type cathode and anode portions 1 and 2a (laterally-separated by a barrier region 3) may be repeated in for example an interdigitated cathode and gate finger pattern at the major surface 11 of the body 10, as illustrated in the cross-sectional view of FIG. 4. Such a vertical transistor may be of either the "normally-off" type of the "normally-on" type.

Figure 5:
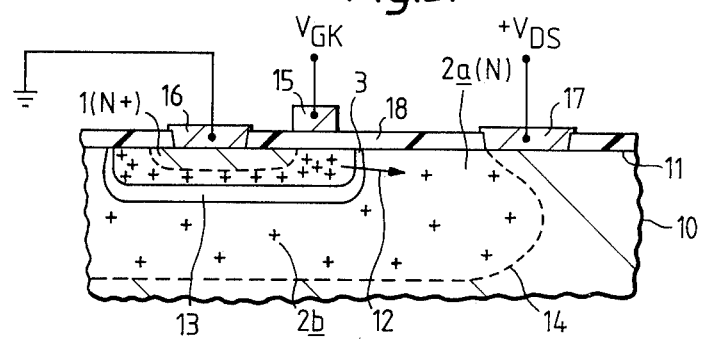
FIG. 5 is a cross-sectional view of another gate-controlled unipolar hot-electron transistor in accordance with the first aspect of the invention, and having its gate located on the opposite side of the barrier region.

FIG. 5 illustrates a further modification of a lateral transistor, in which the transistor gate 15 provided in the vicinity of the barrier region 3 in accordance with the invention is located above the cathode region 1 (instead of the low-doped anode region 2) and is capacitively coupled to the underlying barrier region 3 via an intermediate thin portion of the dielectric layer 18 and an underlying portion of the cathode region 1. In this case at least this underlying portion of the n-type cathode region 1 is less highly doped than in the embodiments of FIGS. 1 and 3 so that the depletion layer and associated positive space-charge extends beneath the gate 15, thereby enabling significant capacitance coupling to occur between the gate 15 and the barrier region 3 to control the barrier height $\phi$ by an appropriate voltage $V_{GK}$ applied to the gate 15. Such an arrangement of the gate 15 on the cathode region 1 can be advantageous in reducing feed-back capacitance between the anode and gate of the transistor. FIG. 5 also illustrates a modified anode connection 17 formed by a metal ohmic contact directly to the lightly-doped portion of the anode region 2.

Figure 6:
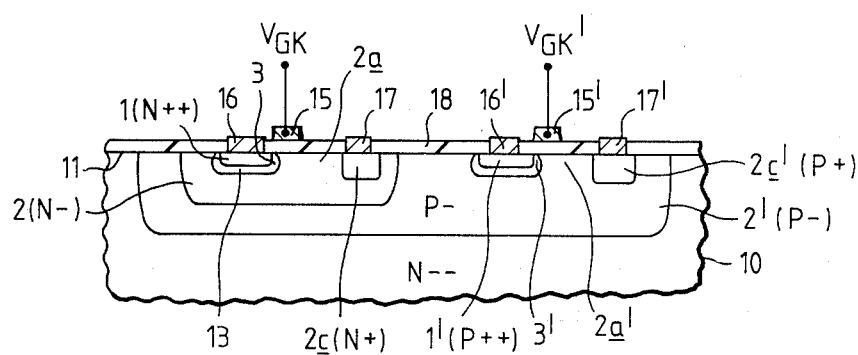
FIG. 6 is a cross-sectional view of a semiconductor integrated circuit in accordance with the first aspect of the invention and having both hot-electron and hot-hole gate-controlled unipolar transistors.

The transistors so far described have been hot-electron transistors. Hot-hole transistors are also possible in accordance with the invention, in which case the first and second regions 1 and 2 are p-type, the barrier region 3 is doped with donor impurity and the current flow across the barrier region 3 is by hot holes. FIG. 6 illustrates a further arrangement in accordance with the invention and comprising both a hot-electron transistor and a hot-hole transistor formed as a complementary conductivity-type pair in a common semiconductor body 10, for example as part of a very fast, low-power logic circuit. The transistor structures illustrated by way of example in this case are similar to those of FIGS. 1 and 3. To avoid confusion the corresponding parts of the hot-hole transistor are designated by corresponding reference signs each with an apostrophe mark (e.g. 3' instead of 3). In FIG. 6 the second region 2' of the hot-hole transistor is a p-type well provided (for example, by ion implantation) in a low-doped n-type substrate (N— —) which forms the bulk of the body 10; whereas the second region 2 of the hot-electron transistor is an n-type well provided (for example, by ion implantation) in the p-type well 2'. To avoid complicating the drawing, the semiconductor body regions are not hatched and the extent of the depletion layers are not indicated in FIG. 6.

Figure 7:
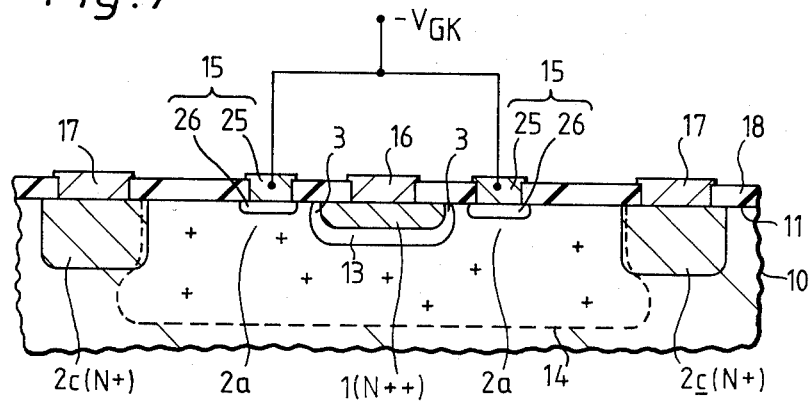
FIG. 7 is a cross-sectional view of another gate-controlled unipolar transistor in accordance with the first aspect of the invention and having a junction-gate.

FIG. 7 illustrates a further modification in accordance with the invention, using a junction-gate. The particular hot-electron transistor illustrated is of the "normally-on" type and is similar in structure to that of FIG. 3. However, instead of using an insulating layer 18, the gate 15 of the transistor of FIG. 7 comprises a metal electrode 25 which is capacitively coupled to the barrier region 3 via the depletion layer of either a Schottky junction or p-n junction which the gate 15 forms with the anode region portion 2a. In the case of a Schottky junction formed between the metal electrode 25 and the region portion 2a, a shallow fully-depleted p-type surface zone 26 may be present in the n-type region portion 2a beneath the metal Schottky electrode 25 to increase the barrier height of the metal-semiconductor Schottky barrier in accordance with the teaching in U.K. Patent GB-A No. 1,459,231. A deeper p-type surface zone 26 which is not fully depleted is provided in the case of a p-n junction gate 15, and this deeper p-type zone 26 is contacted at the surface 11 by a metal ohmic electrode 25. The transistor is generally operated with a negative gate voltage ($-V_{GK}$) to reverse-bias the Schottky or p-n junction, and in this case the transistor can be turned off by increasing the barrier height $\phi$ of the barrier region 3 in a manner similar to that described for the transistor of FIG. 3. Depending on the precise doping concentrations of the various regions such a junction-gate 15 may even be operated with a very low forward-bias (i.e. very low positive gate voltage with this hot-electron device) in order to slightly decrease the barrier height $\phi$ of the barrier region 3. Junction-gate unipolar transistors in accordance with the invention can also be formed with the junction-gate 15 on the other side of the barrier region 3 (i.e. in the first region 1), and/or with the electrode connection to the second region 2 at the opposite major surface of the body, and/or with reversed conductivity types to form a hot-hole transistor.

Figure 8:
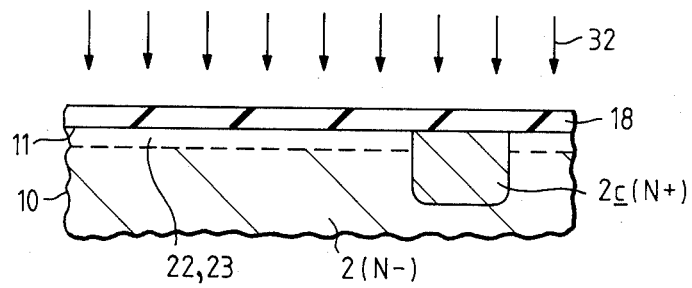
FIGS. 8 and 9 are cross-sectional views of the semiconductor body portion of a transistor as shown in FIG. 1 or FIG. 3, at two stages during its manufacture by a method in accordance with the second aspect of the invention.
Figure 9:
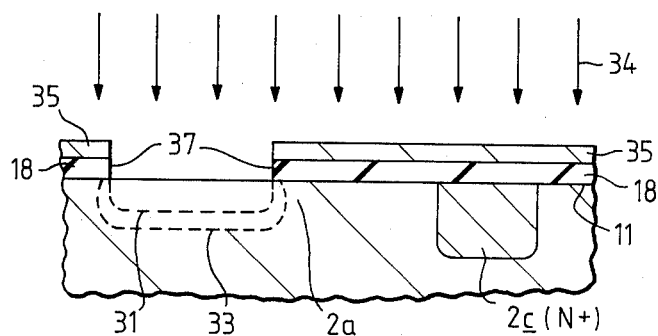

In accordance with the second aspect of the present invention, it is advantageous to use ion implantation to reliably control the formation of the barrier region 3 between the laterally-separated first and second region portions 1 and 2a so as to determine reliably the barrier height $\phi$ and quality of the barrier region in this area. One example of such an ion implantation process will now be described with reference to FIGS. 8 and 9. In this specific example the barrier region 3 is also substantially aligned with the edge of the gate 15 so as to maximize the capacitive coupling between the gate 15 and the barrier region 3. FIGS. 8 and 9 relate particularly to the manufacture of a transistor of similar structure to those of FIGS. 1 and 3.

As illustrated by the structure in FIG. 8, the semiconductor body is provided with the anode contact zone 2c and with a dielectric insulating layer 18 (of for example silicon dioxide) which originally extends over the whole of the upper major surface 11. A dopant ion implantation (indicated by arrows 32) is then effected to provide the additional doping concentration 22 or 23 which, depending on its conductivity type and dose, serves to control the zero-bias barrier height $\phi_o$ of the barrier region 3 at the surface 11 and/or to compensate at least partially for the effect of electrostatic charges in the insulating layer 18.

A conductive layer 35 (part of which subsequently forms the gate 15) is then provided on the insulating layer 18. An opening 37 (which is subsequently used as an implantation window) is then etched in the conductive layer 35 and insulating layer 18 at the area where the cathode region 1 is to be provided. The remaining pattern of the conductive layer 35 and insulating layer 18 provides an implantation mask for the ion implantation of the cathode region 1 and the barrier regions 3 and 13. The edge of the conductive layer 35 at the implantation window 37 will subsequently provide the edge of the final gate 15 with which the barrier region 3 is substantially aligned. FIG. 9 illustrates the use of this mask 18,35 to define these ion implants. A first implant of arsenic ions may be used to form the cathode region 1. The extent of the arsenic implant in the body 10 is indicated by the broken line 31 in FIG. 9. Subsequently boron ions may be implanted to form the barrier regions 3 and 13. The extent of the boron implant is indicated by the broken line 33. The ion bombardment used for these arsenic and boron implants is indicated by arrows 34.

The dopant ion doses and energies and the doping concentrations for the regions may be similar to those used for the previously-disclosed bulk unipolar diodes in U.S. Pat. No. 4,149,174 and the Journal of Applied Physics paper mentioned above. The precise values chosen will depend on the particular characteristics desired for the transistors, for example the zero-bias barrier height $\phi_o$ of the barrier region 3 for determining the zero gate voltage characteristics of the transistor. For some transistors a single boron implant will be satisfactory for forming simultaneously the barrier regions 3 and 13, region 13 of which has a higher barrier height due to the depth of the implant 33 below the implant 31. For some transistors separate boron implants optimized for the regions 3 and 13 may be desirable. The same edge of the implantation window 37 may be used for both the arsenic and boron implants, in which case the thickness of the barrier region 3 can be determined by the scattering and staggering of the boron ions in the silicon lattice below this edge of the window 37. In some cases however (for example where a wider barrier region 3 is required) it will be desirable to slightly widen this implantation window 37 in a controllable manner, between the arsenic implant and the boron implant. This widening may be effected by immersing the body structure for a short time in an etching medium. In this manner an extra degree of control in determining the thickness of the barrier region 3 can be obtained, compared with the thickness of the barrier region 13 which is determined by the difference in the ranges of the arsenic and boron ions (of chosen energies) in the body 10.

It should be noted that in the drawing convention used in FIGS. 8 and 9, all the semiconductor body regions are hatched except for those regions being actually implanted in the implantation step(s) illustrated in the respective Figure.

After annealing the arsenic and boron implants, the unwanted part of the conductive layer 35 is removed to form the gate 15, an insulating layer is provided at least on the cathode region 1 in the implantation window 37, and cathode and anode contact windows are opened before depositing a metal layer from which the cathode and anode connections 16 and 17 are formed.

By way of example, in the devices of FIGS. 1 and 3, the thickness of the barrier region 3 may be about 20 nm or less at the surface 11, the width of the gate 15 extending over part of the region portion 2a beyond the barrier region 3 may be for example 0.25 micrometers, and the spacing between the barrier region 3 and the anode contact zone 2c (which spacing must be sufficient to withstand the field due to the desired maximum anode operating voltage) may be for example at least 1 micrometer.

In the transistors of FIGS. 1 and 3, and FIGS. 4 to 7, direct connections 16 and 17 have been made to the cathode and anode regions 1 and 2 of the transistors. However, particularly in an integrated circuit, the main-current carrying connections to the cathode and anode regions 1 and 2 of a transistor may be via other semiconductor regions which may form part of other circuit elements of the semiconductor device.

In the transistors of FIGS. 1, 3, 4 and 6 the barrier region 3 is substantially aligned with an edge of the gate 15. However, it can be advantageous to slightly space this edge of the gate 15 from the barrier region 3 in the transistors of FIGS. 1, 3, 4 and 6 so that the capacitive coupling of the gate 15 extends deeper into the body 10 and affects more of the barrier region 3.

What I claim is:

1. A semiconductor device comprising a gate-controlled unipolar hot-carrier transistor and having a semiconductor body, first and second semiconductor regions of one conductivity type formed in the body, and a semiconductor barrier region having a net doping concentration of the opposite conductivity type and located between the first and second regions in the body, said barrier region forming part of said gate-controlled unipolar hot-carrier transistor, the first and second regions having laterally-separated portions which adjoin a major surface of the body, which barrier region at least where located between said laterally-separated portions is of the "camel" type and extends to said major surface of the body and is sufficiently thin in the lateral direction such that the depletion layers formed at zero bias voltage with both the first and second regions merge together substantially to deplete said barrier region of mobile charge carriers, bias means for providing and controlling current flow between the first and second regions during operation of the device by thermionic emission of charge carriers of said one conductivity type across said barrier region between said laterally-separated portions of the first and second regions so that the current flow across the barrier region is adjacent to said major surface, and a gate in the vicinity of the barrier region at said major surface, which gate is located over a part of one of said laterally-separated portions of the first and second regions while substantially not extending over the barrier region, said gate being capacitively coupled to said barrier region via a depletion layer formed in said part of said one portion at least in operation of the device so as to permit the current flow by thermionic emission of the charge carriers between the laterally-separated portions of the first and second regions to be controlled by applying a bias voltage from said bias means to the gate to adjust the effective barrier height of the barrier region via the depleted part of said one portion.

2. A semiconductor device as claimed in claim 1, wherein the gate forms a rectifying junction with said part of said one of the laterally-separated portions of the first and second regions, said gate being capacitively coupled to said barrier region by the depletion layer formed in said part by reverse-biasing said rectifying junction during operation of the device.

3. A semiconductor device as claimed in claim 1, wherein the gate is a conductive layer which is present on and capacitively coupled through an insulating dielectric layer on said part of said one portion, said part being depleted of mobile charge carriers by the depletion layer formed by the barrier region with said one of the laterally-separated portions.

4. A semiconductor device as claimed in claim 3, wherein an edge of the barrier region at said major surface is substantially aligned with an edge of said conductive layer of the gate.

5. A semiconductor device as claimed in claim 3 or 4, wherein at least in said one of the laterally-separated portions of the first and second regions an additional doping concentration adjacent the major surface is provided under the insulating dielectric layer to compensate at least partially for the effect of electrostatic charges present in the insulating dielectric layer.

6. A semiconductor device as claimed in claim 1, wherein said one of the laterally-separated portions of the first and second regions has a higher doping concentration of the one conductivity type than the other of said laterally-separated portions.

7. A semiconductor device as claimed in claim 1, wherein said one of the laterally-separated portions of the first and second regions has a lower doping concentration of the one conductivity type than the other of said laterally-separated portions.

8. A semiconductor device as claimed in claim 1, wherein the barrier height of the barrier region at zero bias is sufficiently high such that said transistor is non-conducting until the barrier height is reduced by applying a voltage to the gate.

9. A semiconductor device as claimed in claim 1, wherein the barrier height of the barrier region at zero bias is sufficiently low to render said transistor conducting by applying a bias voltage between the first and second regions even with zero voltage applied to the gate.

10. A semiconductor device as claimed in claim 9, wherein the low barrier height of the barrier region at zero bias is determined by including, adjacent the major surface, a further doping concentration of the one conductivity type in at least said one of the laterally-separated portions of the first and second regions adjacent the barrier region.

11. A semiconductor device comprising a gate-controlled unipolar hot-carrier transistor and having a semiconductor body, first and second semiconductor regions of one conductivity type formed in the body, and a semiconductor barrier region having a net doping concentration of the opposite conductivity type and located between the first and second regions in the body, said barrier region forming part of said gate-controlled unipolar hot-carrier transistor, the first and second regions having laterally-separated portions which adjoin a major surface of the body, the first region being vertically separated from an underlying further portion of the second region in the body, which barrier region where located between the first region and said underlying further portion has a higher barrier-height than that of the barrier region where located between said laterally-separated portions, which barrier region where located between said laterally-separated portions is of the "camel" type and extends to said major surface of the body and is sufficiently thin in the lateral direction such that the depletion layers formed at zero bias voltage with both the first and second regions merge together substantially to deplete said barrier region of mobile charge carriers, bias means for providing and controlling current flow between the first and second regions during operation of the device by thermionic emission of charge carriers of said one conductivity type across said barrier region between said laterally-separated portions of the first and second regions so that the current flow across the barrier region is adjacent to said major surface, and a gate in the vicinity of the barrier region at said major surface, which gate is located over a part of one of said laterally-separated portions of the first and second regions while substantially not extending over the barrier region, said gate being capacitively coupled to said barrier region via a depletion layer formed in said part of said one portion at least in operation of the device so as to permit the current flow by thermionic emission of the charge carriers between the laterally-separated portions of the first and second regions to be controlled by applying a bias voltage from said bias means to the gate to adjust the effective barrier height of the barrier region via the depleted part of said one portion.

12. A device as claimed in claim 1 or claim 11, wherein the gate is located laterally sufficiently close to the barrier region at said major surface such that said part of said one portion via which the gate is coupled to said barrier region is located within the spread of the depletion layer formed with the barrier region at zero bias between the first and second regions.

13. A semiconductor device as claimed in claim 11, wherein electrical connections to the first region and to the gate are provided at one major surface, and an electrical connection to the second region is provided at an opposite major surface of the body.

14. A semiconductor device as claimed in claim 1 or 11, wherein electrical connections to the first and second regions and to the gate are provided at the same major surface of the body.

15. A semiconductor device as claimed in claim 1 or 11, wherein at least two of said gate-controlled unipolar hot-carrier transistors are formed in the same semiconductor body, the first transistor having n-type first and second regions, with hot electron flow across its barrier region, and the second transistor having p-type first and second regions with hot-hole flow across its barrier region.

16. A semiconductor device as claimed in claim 1 or 11, wherein the thickness of said barrier region in the lateral direction at said surface is no more than about 20 nanometers.

* * * * *